United States Patent
Engel et al.

(10) Patent No.: US 6,633,498 B1
(45) Date of Patent: Oct. 14, 2003

(54) MAGNETORESISTIVE RANDOM ACCESS MEMORY WITH REDUCED SWITCHING FIELD

(75) Inventors: Bradley N. Engel, Chandler, AZ (US); Jason Allen Janesky, Gilbert, AZ (US); Nicholas D. Rizzo, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 3 days.

(21) Appl. No.: 10/173,907

(22) Filed: Jun. 18, 2002

(51) Int. Cl.[7] ............................................... G11C 11/00
(52) U.S. Cl. ........................ 365/158; 365/171; 365/173
(58) Field of Search ................. 365/158, 171, 365/173

(56) References Cited

U.S. PATENT DOCUMENTS 5,959,880 A * 9/1999 Shi et al. .................... 365/158
5,966,323 A * 10/1999 Chen et al. .................. 365/158
6,127,045 A * 10/2000 Gill ............................. 428/611
6,351,409 B1 * 2/2002 Rizzo et al. ................. 365/158

* cited by examiner

*Primary Examiner*—Son T. Dinh
(74) *Attorney, Agent, or Firm*—William E. Koch

(57) ABSTRACT

A magnetoresistive tunneling junction memory cell (10) including a pinned ferromagnetic region (17) having a magnetic moment vector (47) fixed in a preferred direction in the absence of an applied magnetic field wherein the pinned ferromagnetic region has a magnetic fringing field (96), an electrically insulating material positioned on the pinned ferromagnetic region to form a magnetoresistive tunneling junction (16), and a free ferromagnetic region (15) having a magnetic moment vector (53) oriented in a position parallel or anti-parallel to that of the pinned ferromagnetic region wherein the magnetic fringing field is chosen to obtain a desired switching field.

23 Claims, 4 Drawing Sheets

US 6,633,498 B1

MAGNETORESISTIVE RANDOM ACCESS MEMORY WITH REDUCED SWITCHING FIELD

FIELD OF THE INVENTION

This invention relates to semiconductor memory devices. More particularly, the present invention relates to semiconductor random access memory devices that utilize a magnetic field.

BACKGROUND OF THE INVENTION

Memory devices are an extremely important component in electronic systems. The three most important commercial high-density memory technologies are SRAM, DRAM, and FLASH. Each of these memory devices uses an electronic charge to store information and each has its own advantages. SRAM has fast read and write speeds, but it is volatile and requires large cell area. DRAM has high density, but it is also volatile and requires a refresh of the storage capacitor every few milliseconds. This requirement increases the complexity of the control electronics.

FLASH is the major nonvolatile memory device in use today. Typical non-volatile memory devices use charges trapped in a floating oxide layer to store information. Drawbacks to FLASH include high voltage requirements and slow program and erase times. Also, FLASH memory has a poor write endurance of $10^4$–$10^6$ cycles before memory failure. In addition, to maintain reasonable data retention, the thickness of the gate oxide has to stay above the threshold that allows electron tunneling, thus restricting FLASH's scaling trends.

To overcome these shortcomings, magnetic memory devices are being evaluated. One such device is magnetoresistive random access memory (hereinafter referred to as "MRAM"). MRAM has the potential to have speed performance similar to DRAM. To be commercially viable, however, MRAM must have comparable memory density to current memory technologies, be scalable for future generations, operate at low voltages, have low power consumption, and have competitive read/write speeds.

For an MRAM device, the stability of the memory state, the repeatability of the read/write cycles, and the power consumption are some of the most important aspects of its design characteristics. A memory state in MRAM is not maintained by power, but rather by the direction of the magnetic moment vector. Storing data is accomplished by applying magnetic fields and causing a magnetic material in a cell to be magnetized into either of two possible memory states. Recalling data is accomplished by sensing resistive changes in the cell when magnetic fields are applied. The magnetic fields are created by passing currents through strip lines external to the magnetic structure or through the magnetic structures themselves.

Conventional MRAM devices rely on the bit shape with aspect ratio to create a shape anisotropy that provides the switching field. As the bit dimension shrinks, three problems occur. First, the switching field increases for a given shape and film thickness, requiring more current to switch. Second, the total switching volume is reduced so that the energy barrier for reversal, which is proportional to volume and switching field, decreases. The energy barrier refers to the amount of energy needed to switch the magnetic moment vector from one state to the other.

The switching field is also dependant on material properties, so there is a lower limit for typical materials. As the switching field increases, more current is required to change the state of a MRAM bit and, consequently, more power is consumed. Therefore, a need exists to lower the switching field and decrease the power consumption of MRAM devices.

Accordingly, it is an object of the present invention to provide a new and improved magnetoresistive random access memory device with a decreased switching field.

SUMMARY OF THE INVENTION

To achieve the objects and advantages specified above and others, a magnetoresistive tunneling junction memory cell with a switching field and an easy axis is disclosed. The MRAM cell includes a first magnetic region, the first magnetic region has a resultant magnetic moment vector fixed in a preferred direction in the absence of an applied magnetic field wherein the first magnetic region has a magnetic fringing field. An electrically insulating material is positioned on the first magnetic region to form a magnetoresistive tunneling junction.

A second magnetic region is positioned on the electrically insulating material and has a magnetic moment vector adjacent to the tunnel barrier and oriented in a direction parallel or anti-parallel to that of the first magnetic region. In the preferred embodiment, at least one of the first and second magnetic regions include N ferromagnetic layers which are anti-ferromagnetically coupled, where N is a whole number greater than or equal to two. Further, the memory cell operates in a toggle writing mode wherein the magnetic fringing field creates a bias field within the second magnetic region and along the easy axis and, consequently, changes the switching field of the magnetoresistive tunneling junction memory cell.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
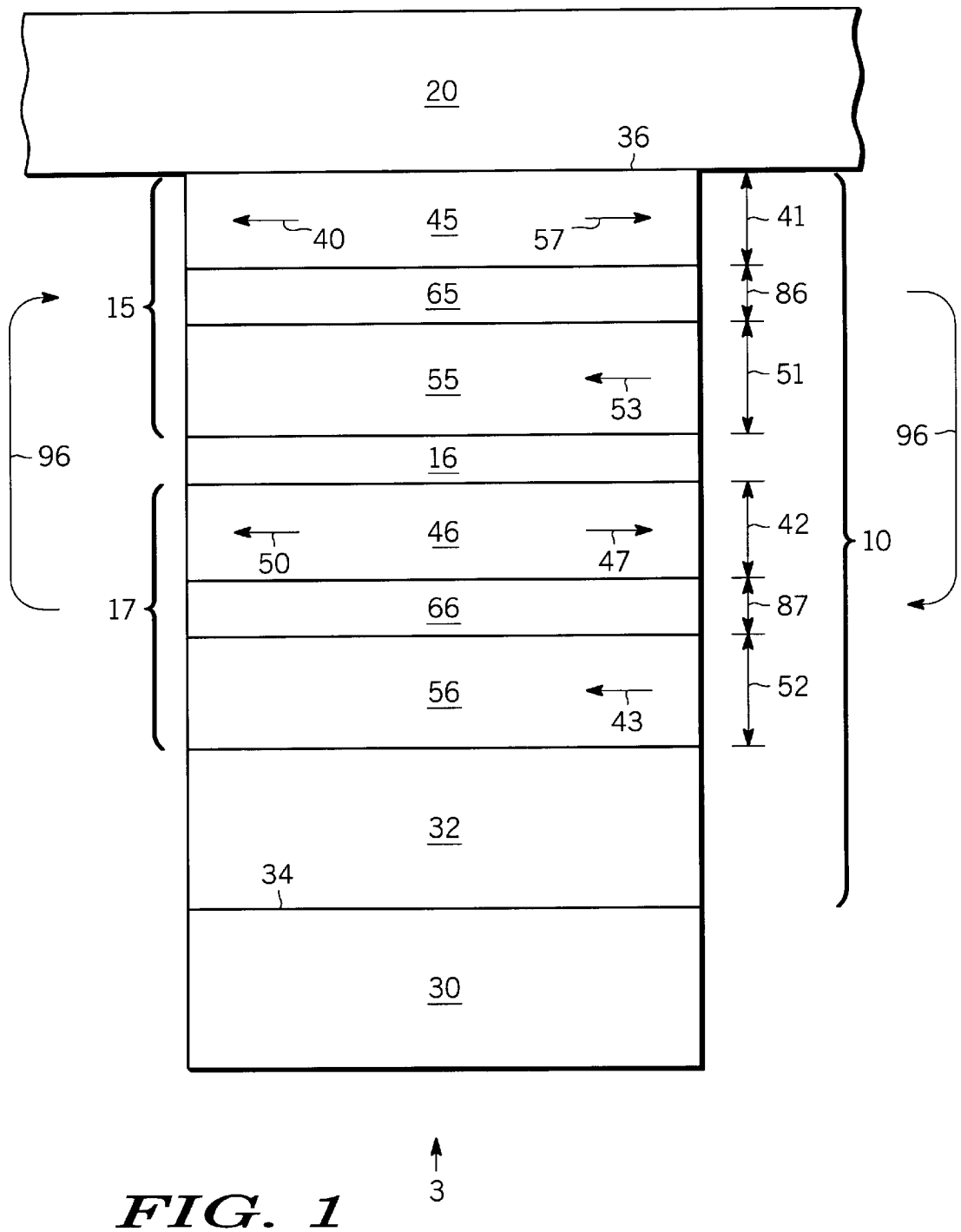
FIG. 1 is a sectional view of a magnetoresistive random access memory device with reduced switching field in accordance with the present invention.

Turn now to FIG. 1, which illustrates a simplified sectional view of an MRAM array 3 in accordance with the present invention. In this illustration, only a single MRAM device 10 is shown, but it will be understood that MRAM array 3 generally includes of a number of MRAM devices 10 and we are showing only one such device for simplicity to illustrate the operation of MRAM array 3 using a toggle writing method. Further, more information in regard to the toggle writing method used in this embodiment can be found in a U.S. Pat. No. 09/978,859 entitled "A Method of Writing to a Scalable Magnetoresistance Random Access Memory Element" filed on Oct. 16, 2001, and incorporated herein by reference.

MRAM device 10 is sandwiched therebetween a word line 20 and a digit line 30. Word line 20 and digit line 30 include conductive material such that a current can be passed therethrough. In this illustration, word line 20 is positioned on a surface 36 of MRAM device 10 and digit line 30 is positioned on a surface 34 of MRAM device 10 wherein digit line 30 is directed approximately at a 90° angle relative to word line 20 (See FIG. 2). However, it will be understood that the positioning of word line 20 and digit line 30 is for illustrative purposes only wherein many other configurations are possible.

Figure 2:
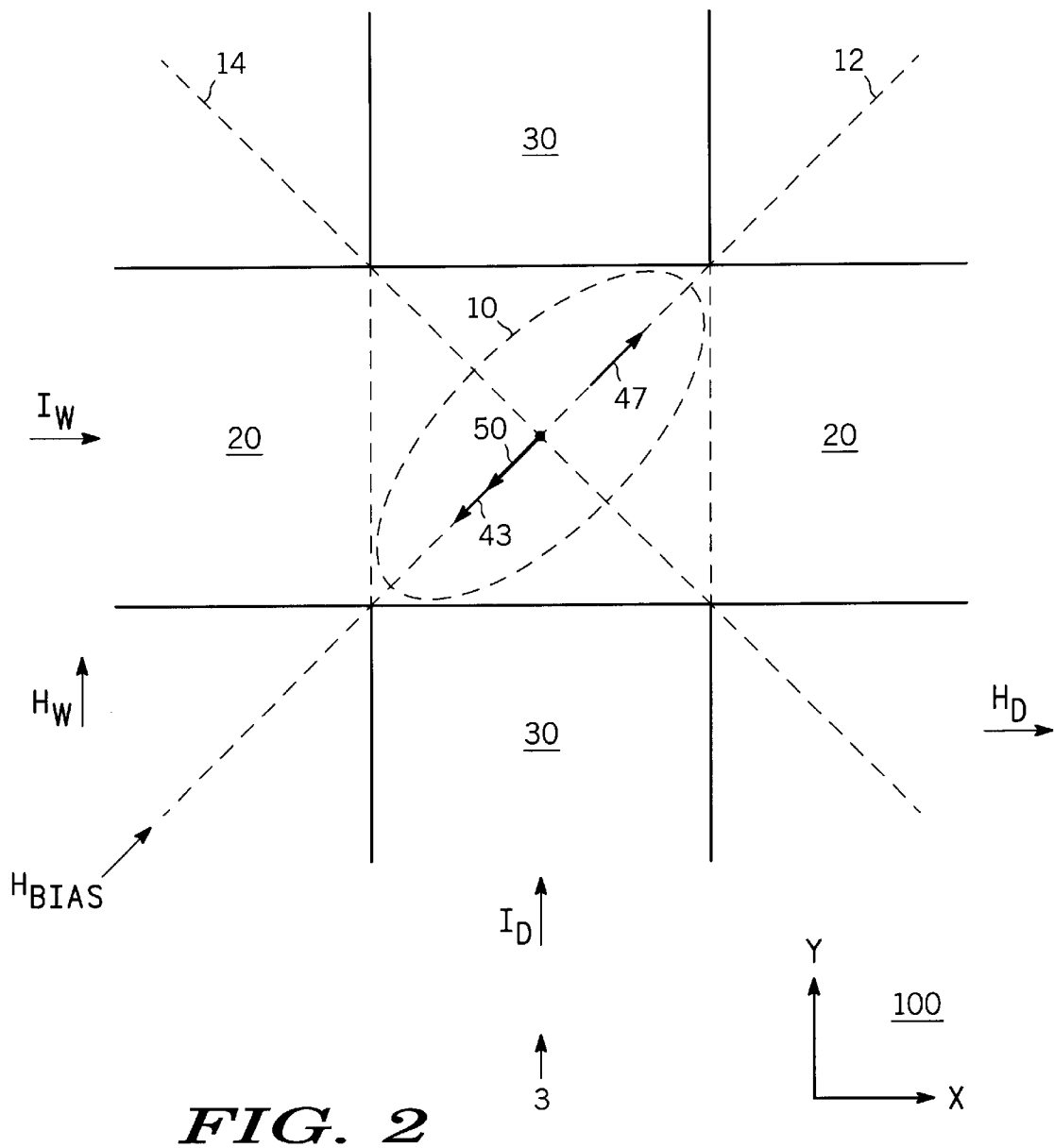
FIG. 2 is a simplified plan view of a magnetoresistive random access memory device with reduced switching field in accordance with the present invention.

Turn now to FIG. 2 which illustrates a simplified plan view of MRAM array 3 in accordance with the present invention. To simplify the description of MRAM device 10, all directions will be referenced to an x- and y-coodinate system 100 as shown. The purpose of word line 20 and digit line 30 is to create a magnetic field within MRAM device 10. A positive word current (i.e. a word current flowing in the positive x-direction), $I_W$, will produce a circumferential word magnetic field, $H_W$, and a positive digit current (i.e. a digit current flowing in the positive y-direction), $I_D$, will produce a circumferential digit magnetic field, $H_D$. Since word line 20 is above MRAM device 10, in the plane of the element, $H_W$ will be applied to MRAM device 10 in the positive y-direction for positive $I_W$. Similarly, since digit line 30 is below MRAM device 10, in the plane of the element, $H_D$ will be applied to MRAM device 10 in the positive x-direction for positive $I_D$. The behavior of a current produced magnetic field is well known to those skilled in the art and will not be elaborated upon further here.

Turning back to FIG. 1, MRAM device 10 includes a magnetic region 15, a tunneling barrier 16, and a magnetic region 17, wherein tunneling barrier 16 is sandwiched therebetween magnetic region 15 and magnetic region 17. In the preferred embodiment, tunneling barrier 16 can include an electrically insulating material, such as aluminum oxide, or the like to form a tunneling junction. Also in the preferred embodiment, magnetic region 15 includes a tri-layer structure which has an anti-ferromagnetic coupling spacer layer 65 sandwiched therebetween a ferromagnetic layer 45 and a ferromagnetic layer 55.

Anti-ferromagnetic coupling spacer layer 65 has a thickness 86 and ferromagnetic layers 45 and 55 have thicknesses 41 and 51, respectively. Further, in the preferred embodiment, magnetic region 17 has a tri-layer structure which includes an anti-ferromagnetic coupling spacer layer 66 sandwiched therebetween a ferromagnetic layer 46 and a ferromagnetic layer 56. Anti-ferromagnetic coupling spacer layer 66 has a thickness 87 and ferromagnetic layers 46 and 56 have thicknesses 42 and 52, respectively.

It will be understood that magnetic regions 15 and 17 can include N ferromagnetic layers wherein N is a whole number greater than or equal to two. However, in the preferred embodiment, N is equal to two so that magnetic regions 15 and 17 each include one tri-layer. Tri-layer structures are often referred to as synthetic anti-ferromagnetic (hereinafter referred to as "SAF") structures.

Generally, anti-ferromagnetic coupling spacer layers 65 and 66 include at least one of the elements Ru, Os, Ti, Cr, Rh, Pt, Cu, Pd, or combinations thereof. Further, ferromagnetic layers 45, 55, 46, and 56 include at least one of elements Ni, Fe, Co, or combinations thereof. Also, it will be understood that magnetic regions 15 and 17 can include SAF layer material structures other than tri-layer structures and the use of tri-layer structures in this embodiment is for illustrative purposes only. For example, one such SAF layer material structure could include a five-layer stack of a ferromagnetic layer/anti-ferromagnetic coupling spacer layer/ferromagnetic layer/anti-ferromagnetic coupling spacer layer/ferromagnetic layer structure. Also, magnetic region 17 can include other magnetic material structures which produce a magnetic moment vector, such as a single pinned magnetic layer or a permanent magnetic layer with a high coercivity. Additionally, the bias field could be supplied from other magnetic layers or external magnets.

Ferromagnetic layers 45 and 55 each have a magnetic moment vector 57 and 53, respectively, that are usually held anti-parallel by coupling of anti-ferromagnetic coupling spacer layer 65. Ferromagnetic layers 46 and 56 each have a magnetic moment vector 47 and 43, respectively, that are usually held anti-parallel by coupling of anti-ferromagnetic coupling spacer layer 66. Also, magnetic region 15 has a resultant magnetic moment vector 40 and magnetic region 17 has a resultant magnetic moment vector 50.

Resultant magnetic moment vector 40 is the vector sum of magnetic moment vectors 53 and 57 and resultant magnetic moment vector 50 is the vector sum of magnetic moment vectors 43 and 47. In the case of a balanced magnetic moment between layers 45 and 55, resultant magnetic moment vector 40 is approximately zero. However, a preferred direction is still determined by the magnetic moment vectors (i.e. magnetic moment vectors 47 and 53) adjacent to tunneling barrier 16.

In the preferred embodiment, resultant magnetic moment vectors 40 and 50 are oriented along an anisotropy easy axis 12 (See FIG. 2) in a direction that is at an angle, preferably 45°, from word line 20 and digit line 30 (See FIG. 2). Easy axis 12 is also oriented approximately 90° from an anisotropy hard axis 14. (See FIG. 2). Further, magnetic region 15 is a free magnetic region, meaning that resultant magnetic moment vector 40 is free to rotate in the presence of an applied magnetic field. Magnetic region 17 is a pinned magnetic region, meaning that resultant magnetic moment vector 50 is generally not free to rotate in the presence of an applied magnetic field and is used as a reference. In the preferred embodiment, resultant magnetic moment vector 50 is pinned due to an anti-ferromagnetic coupling between magnetic region 17 and an anti-ferromagnetic layer 32.

In the preferred embodiment, the magnitude of resultant magnetic moment vector 50 is adjusted to obtain a magnetic fringing field 96 which is aligned along anisotropy easy axis 12 and is incident on magnetic region 15. The magnitude and direction of magnetic fringing field 96 is substantially determined by the structure and properties of magnetic region 17, as will be discussed separately.

MRAM device 10 is capable of flowing a tunneling current through tunneling barrier 16. The tunneling current substantially depends on a tunneling magnetoresistance of MRAM device 10, which is governed by the relative orientation of magnetic moment vectors 53 and 47 which are adjacent to tunneling barrier 16. If magnetic moment vectors 53 and 47 are parallel, then MRAM device 10 has a low magnetoresistance and a voltage bias therebetween word line 20 and digit line 30 will create a larger tunneling current through MRAM device 10. This state is defined as a "1". If magnetic moment vectors 53 and 47 are anti-parallel, then MRAM device 10 will have a high magnetoresistance and an applied voltage bias therebetween word line 20 and digit line 30 will create a smaller current through MRAM device 10. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moment vectors in the free ferromagnetic region to be orientated in either one of parallel and anti-parallel directions relative to the magnetic moment vector in the pinned ferromagnetic region.

While anti-ferromagnetic coupling layer 65 is illustrated between ferromagnetic layers 45 and 55 in tri-layer structure 15, it will be understood that ferromagnetic layers 45 and 55 could be anti-ferromagnetically coupled through other means, such as magnetic fields or other features. For example, when the aspect ratio of a MRAM cell is reduced to five or less, the ferromagnetic layers are coupled anti-parallel from magnetic flux closure.

In the preferred embodiment, MRAM device 10 has tri-layer structures 15 and 17 that have a length/width ratio in a range of one to five for a non-circular plan. We illustrate a plan with an aspect ratio equal to two (See FIG. 2). MRAM device 10 is elliptical in shape in the preferred embodiment to minimize the contribution to switching field variations from shape anisotropy and also because it is easier to use photolithographic processing to scale the device to smaller dimensions laterally. However, it will be understood that MRAM device 10 can have other shapes, such as circular, square, rectangular, diamond, or the like, but is illustrated as being elliptical for simplicity and improved performance.

Further, during fabrication of MRAM array 3, each succeeding layer (i.e. 30, 32, 56, etc.) is deposited or otherwise formed in sequence and each MRAM device 10 may be defined by selective deposition, photolithography processing, etching, etc. in any of the techniques well known to those skilled in the art. During deposition of at least the ferromagnetic layers 45 and 55, a magnetic field is provided to set anisotropy easy axis 12 (See FIG. 2) for this pair (induced anisotropy). The provided magnetic field creates a preferred anisotropy axis for magnetic moment vectors 53 and 57. In the preferred embodiment, anisotropy easy axis 12 is chosen to be at a 45° angle between word line 20 and digit line 30, as will be discussed presently.

Turn back to FIG. 2, which illustrates the simplified plan view of MRAM array 3 in accordance with the present invention. To simplify the description of MRAM device 10, all directions will be referenced to x- and y-coordinate system 100 as shown. To further simplify the description, it is again assumed that N is equal to two so that MRAM device 10 includes one tri-layer structure in magnetic region 17 with magnetic moment vectors 43 and 47, as well as resultant magnetic moment vector 50. Also, only the magnetic moment vectors of region 17 are illustrated for simplicity.

For illustrative purposes, it is assumed that anisotropy easy axis 12 for magnetic moment vectors 43 and 47 is directed at a 45° angle relative to the negative x-and negative y-directions and at a 45° angle relative to the positive x- and positive y-directions. As an example, FIG. 2 shows that magnetic moment vector 43 is directed at a 45° angle relative to the negative x- and negative y-directions. Since magnetic moment vector 47 is generally oriented anti-parallel to magnetic moment vector 43, it is directed at a 45° angle relative to the positive x- and positive y-directions. As discussed previously, the magnitude of resultant magnetic moment vector 50 is adjusted to obtain magnetic fringing field 96 which is aligned along anisotropy easy axis 12 and incident on magnetic region 15.

Figure 3:
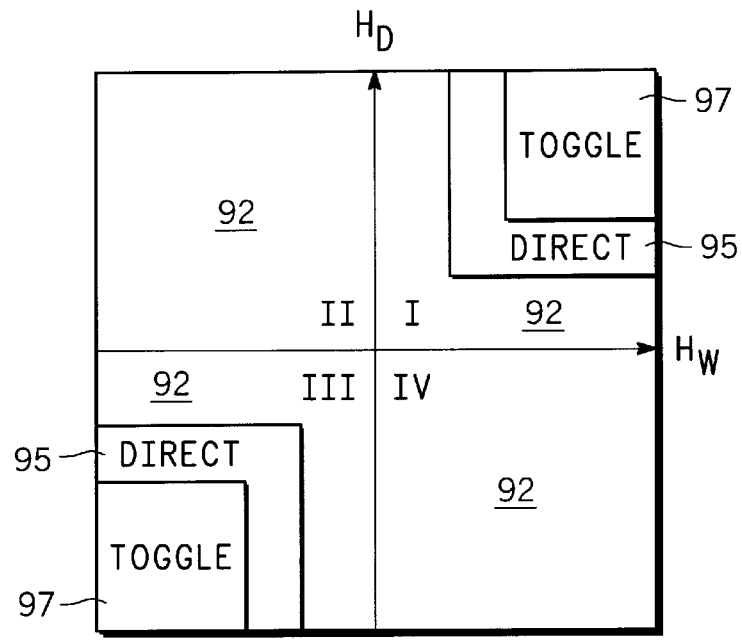
FIG. 3 is a schematic representation of the magnetic field amplitude combinations that produce the direct or toggle write mode in the magnetoresistive random access memory device.

Turn now to FIG. 3, which schematically illustrates the switching behavior of a SAF tri-layer structure similar to tri-layer structures 15 and 17 subjected to the particular pulse sequence described in U.S. Pat. No. 09/978,859 incorporated as reference above. The x-axis corresponds to the word line magnetic field amplitude, $H_W$, and the y-axis corresponds to the digit line magnetic field amplitude, $H_D$. There are three modes or regions of operation illustrated in FIG. 3. In a region 92 there is no switching. For MRAM operation in a region 95, a direct writing method is in effect. When using the direct writing method, there is no need to determine the initial state of the MRAM device because the state is only switched if the state being written is different from the state that is stored.

For MRAM operation in a region 97, a toggle writing method is in effect. When using the toggle writing method, there is a need to determine the initial state of MRAM device 10 before writing because the state is switched every time MRAM device 10 is written to, regardless of the direction of the currents as long as the same polarity current pulses are chosen for both word line 20 and digit line 30. For example, if a '1' is initially stored, then the state of MRAM device 10 will be switched to a '0' after one positive current pulse sequence is flowed through word line 20 and digit line 30. Repeating the positive current pulse sequence on the stored '0' state returns the stored state to a '1'.

Thus, to be able to write MRAM device 10 into the desired state, an initial state of MRAM device 10 is read and compared to a state to be written. The reading and comparing may require additional logic circuitry, including a buffer for storing information and a comparator for comparing memory states. MRAM device 10 is then written to only if the stored state and the state to be written are different.

One of the advantages of the toggle writing method is that the power consumed is lowered because only the differing bits are switched. An additional advantage of using the toggle writing method is that only uni-polar voltages are required and, consequently, smaller N-channel transistors can be used to drive MRAM device 10. A further advantage of the toggle writing method is that magnetic fringing field 96 can be used to. constructively add to the applied magnetic field thereby decreasing the effective switching field such that $H_{Sw}^{Eff}$ is less than $H_{Sw}^{O}$, as will be discussed presently, wherein $H_{Sw}^{o}$ corresponds to the applied magnetic field needed to switch MRAM device 10 when a bias magnetic field, $H_{Bias}$, is zero (See FIG. 2).

As discussed previously, the magnitude of resultant magnetic moment vector 50 is adjusted to obtain magnetic fringing field 96. The structure and properties of magnetic region 17 are chosen so that magnetic fringing field 96 creates bias field, $H_{Bias}$, along anisotropy easy axis 12 of MRAM device 10 and incident upon magnetic region 15. The effect of $H_{Bias}$ is to reduce the magnitude of $H_{Sw}^{Eff}$ needed to change the state of MRAM device 10. Consequently, the current (i.e. $I_D$ and $I_W$) needed to operate MRAM device 10 is reduced, as well as the power consumption. The effect of $H_{BiaS}$ will be discussed in the following examples.

Figure 4:
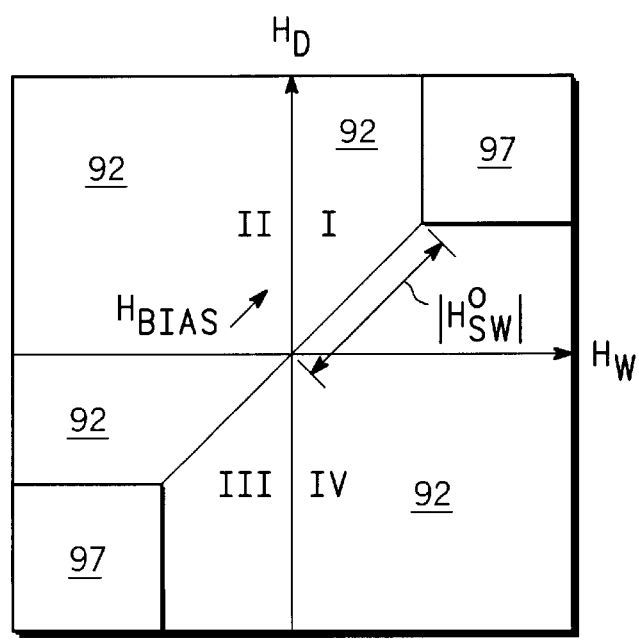
FIG. 4 is a graph illustrating a schematic representation of the magnetic switching field for the toggling regime.

Turn now to FIG. 4 in which a graph 42 illustrates a schematic representation of effective switching field, $H_{Sw}^{Eff}$ for region 97 of a tri-layer SAF structure when $H_{Bias}$ is equal to zero. In this illustration, region 95 for the direct writing method is minimized by nearly balanced moments and is not shown for simplicity. When $H_{Bias}$ is equal to zero (i.e. a nearly balanced SAF), region 97 is symmetric about an origin of graph 42 wherein $H_D$ is equal to zero Oersteds and $H_W$ is equal to zero Oersteds. A nearly balanced SAF is when, for example, magnetic moment vectors 47 and 43 have approximately the same magnitude so that resultant magnetic moment vector 50 is approximately zero. For this example, the magnitude of $H_{Sw}^{Eff}$ needed to change the state of MRAM device 10 is given by:

$$H_{Sw}^{Eff} = H_{Sw}^0 = \frac{H_D + H_W}{\sqrt{2}}.$$

Figure 5:
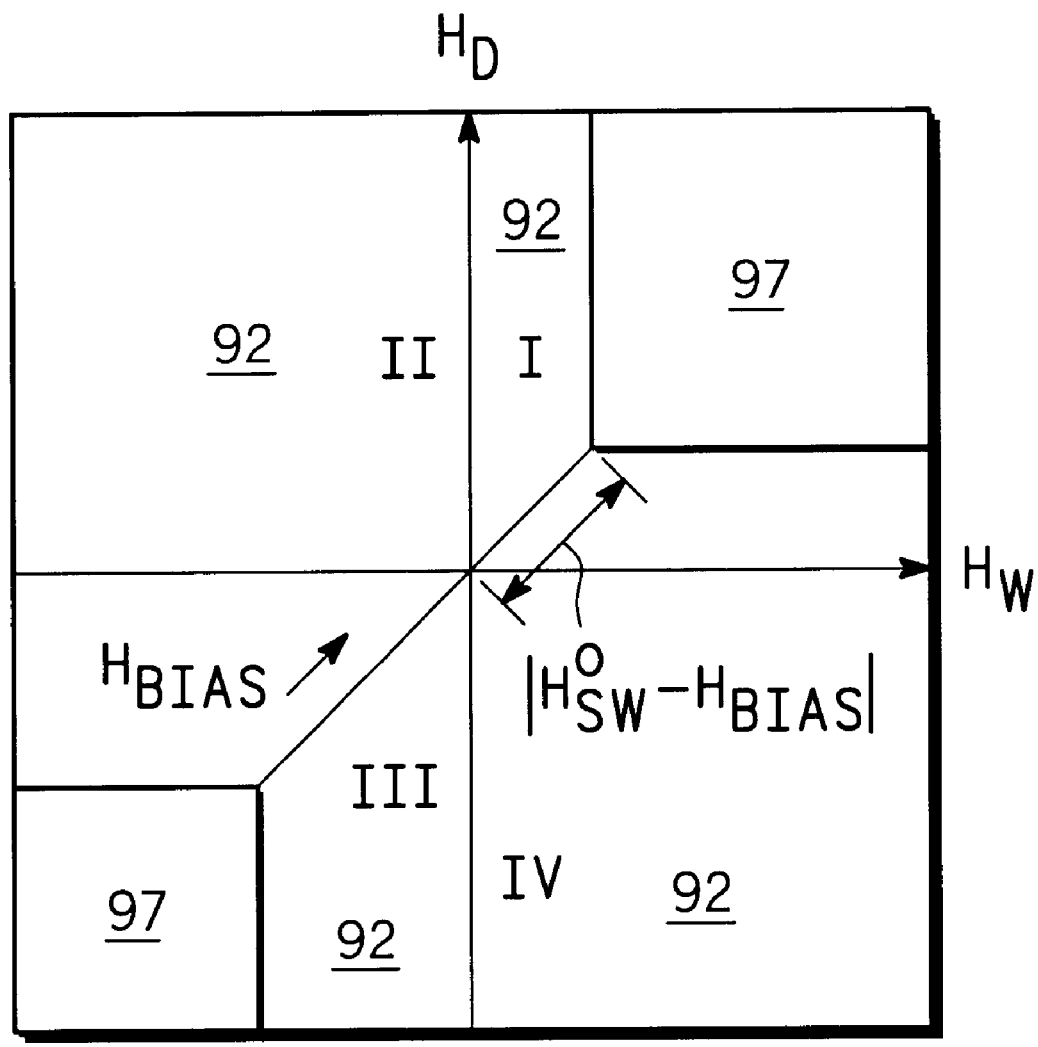
FIG. 5 is a graph illustrating a schematic representation of the magnetic switching field for the toggling regime with a fringing field.

Turn now to FIG. 5 in which a graph 44 illustrates a schematic of effective switching field, $H_{Sw}^{Eff}$ for region 97 of a tri-layer structure 15 when $H_{Bias}$ is nonzero (i.e. an unbalanced SAF). In this illustration, region 95 for the direct writing method is minimized by nearly balanced moments and is not shown for simplicity. In this example, thickness 87 of anti-ferromagnetic coupling spacer layer 66 and thicknesses 42 and 52 are chosen to obtain a desired $H_{Bias}$. An important point is that by choosing thicknesses 87, 42, and 52 to obtain a desired magnetic fringing field 96, $H_{Sw}$ can be chosen to be a desired value.

An unbalanced SAF is when, for example, magnetic moment vectors 47 and 43 have substantially different magnitudes so that resultant magnetic moment vector 50 is nonzero. In this particular example, thickness 87 of anti-ferromagnetic coupling spacer layer 66 and thicknesses 42 and 52 are chosen to obtain a desired nonzero $H_{Bias}$ wherein thickness 42 is chosen to be substantially different than thickness 52 such that the magnitude of magnetic moment vector 47 is substantially unequal to the magnitude of magnetic moment vector 43.

The switching magnetic field needed to change the state of MRAM device 10 when $H_{Bias}$ is nonzero is given by:

$$H_{Sw}^{Eff} = H_{Sw}^0 - H_{Bias} = \frac{H_D + H_W}{\sqrt{2}} - H_{Bias},$$

which indicates that $H_{Sw}^O$ has been reduced by an amount equal to $H_{Bias}$, so that effective switching magnetic field, $H_{Sw}^{Eff}$, has been reduced to a value less than $H_{Sw}^O$. This can also be seen in FIG. 5 wherein region 97 is no longer symmetric about the origin. The effect of HBias is to shift region 97 closer to the origin when $H_D$ and $H_W$ are both positive (i.e. Quadrant I). However, it will be understood that similar results can be obtained if the direction of $H_{Bias}$ is reversed, wherein region 97 when $H_D$ and $H_W$ are negative would shift closer to the origin (not shown). Hence, because the toggling writing method only requires a single polarity of current pulses, the asymmetric shift in toggling regions 97 can be used to reduce the switching threshold for both states of MRAM device 10.

Thus, when using the toggle writing method the effective magnetic switching field of a MRAM device can be obtained by creating a fringing magnetic field with the pinned ferromagnetic region, wherein the fringing magnetic field creates a bias magnetic field within the free ferromagnetic region and along the anisotropy easy axis. The bias magnetic field reduces the power required to switch the state of the MRAM device.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A magnetoresistive tunneling junction memory cell with a switching field, the cell comprising:

a first magnetic region having a resultant magnetic moment vector fixed in a preferred direction in the absence of an applied magnetic field;

an electrically insulating material positioned on the first magnetic region to form a magnetoresistive tunneling junction;

a second magnetic region positioned on the electrically insulating material, the second magnetic region having an anisotropy easy axis and a resultant magnetic moment vector oriented in a position parallel or anti-parallel to that of the first magnetic region;

wherein the magnetoresistive tunneling junction memory cell operates in a toggle writing mode;

wherein a bias field along the anisotropy easy axis and within the second magnetic region may be created by an applied magnetic field to alter the switching field; and wherein at least one of the first and second magnetic regions include a synthetic anti-ferromagnetic layer material that has an adjustable magnetic switching volume wherein the synthetic anti-ferromagnetic layer material includes N ferromagnetic layers which are anti-ferromagnetically coupled, where N is a whole number greater than or equal to two.

2. A magnetoresistive tunneling junction memory cell with a switching field, the cell comprising:

a first magnetic region having a resultant magnetic moment vector fixed in a preferred direction in the absence of an applied magnetic field wherein the first magnetic region has a thickness and a magnetic fringing field;

an electrically insulating material positioned on the first magnetic region to form a magnetoresistive tunneling junction;

a second magnetic region positioned on the electrically insulating material, the second magnetic region having an anisotropy easy axis and a resultant magnetic moment vector oriented In a position parallel or anti-parallel to that of the first magnetic region;

wherein the magnetoresistive tunneling junction memory cell operates in a toggle writing mode;

wherein the magnetic fringing field creates a bias field along the anisotropy easy axis and within the second magnetic region; and wherein at least one of the first and second magnetic regions include a synthetic anti-ferromagnetic layer material that has an adjustable magnetic switching volume wherein the synthetic anti-ferromagnetic layer material includes N ferromagnetic layers which are anti-ferromagnetically coupled, where N is a whole number greater than or equal to two.

3. An apparatus as claimed in claim 2 wherein the resultant magnetic moment vector of the first magnetic region is chosen to obtain the switching field.

4. An apparatus as claimed in claim 2 wherein at least one of the thickness of the first magnetic region and the material included in the first magnetic region is chosen to obtain the switching field.

5. A method as claimed in claim 2 wherein the magnetic fringing field is aligned in a direction substantially parallel with the anisotropy easy axis.

6. An apparatus as claimed in claim 2 wherein the magnetic fringing field is chosen to obtain the switching field.

7. An apparatus as claimed in claim 2 wherein the switching field is reduced by an amount approximately equal to the bias field.

8. An apparatus as claimed in claim 2 wherein each N ferromagnetic layer is anti-ferromagnetically coupled by sandwiching a layer of an anti-ferromagnetic coupling material between each adjacent ferromagnetic layer.

9. An apparatus as claimed in claim 2 wherein at least one layer of the anti-ferromagnetic coupling material includes one of Ru, Re, Os, Ti, Cr, Rh, Pt, Cu, and Pd.

10. An apparatus as claimed in claim 2 wherein at least one of the N ferromagnetic layers includes one of Ni, Fe, Mn, Co, and combinations thereof.

11. A magnetoresistive tunneling junction memory cell with a switching field, the cell comprising:
   a first magnetic region with a thickness, the first magnetic region having a resultant magnetic moment vector fixed in a preferred direction in the absence of an applied magnetic field wherein the first magnetic region has a magnetic fringing field;
   an electrically insulating material positioned on the first magnetic region to form a magnetoresistive tunneling junction;
   a second magnetic region positioned on the electrically insulating material and having an anisotropy easy axis and a resultant magnetic moment vector oriented in a position parallel or anti-parallel to that of the first magnetic region and wherein at least one of the first and second magnetic regions include N ferromagnetic layers which are anti-ferromagnetically coupled, where N is a whole number greater than or equal to two;
   wherein the magnetoresistive tunneling junction memory cell is configured to operate in a toggle writing mode; and
   wherein the magnetic fringing field creates a bias field along the anisotropy easy axis and within the second magnetic region.

12. An apparatus as claimed in claim 11 wherein the resultant magnetic moment vector of the first magnetic region is chosen to obtain the switching field.

13. An apparatus as claimed in claim 11 wherein at least one of the thickness of the first magnetic region and the material included in the first magnetic region is chosen to obtain the switching field.

14. An apparatus as claimed in claim 11 wherein at least one layer of the anti-ferromagnetic coupling material includes one of Ru, Re, Os, Ti, Cr, Rh, Pt, Cu, and Pd.

15. An apparatus as claimed in claim 11 wherein at least one of the N ferromagnetic layers includes one of Ni, Fe, Mn, Co, and combinations thereof.

16. An apparatus as claimed in claim 11 wherein the magnetic fringing field is chosen to obtain the switching field.

17. An apparatus as claimed in claim 11 wherein the switching field is reduced by an amount approximately equal to the bias field.

18. A method of reducing a switching field for a magnetoresistive tunneling junction memory cell comprising the steps of:
   providing a substrate defining a surface;
   supporting a pinned magnetic region having a thickness, a magnetic switching volume, and a resultant magnetic moment vector on the substrate wherein the resultant magnetic moment vector is oriented in a preferred direction both with and without an applied magnetic field, wherein the pinned magnetic region has a magnetic fringing field;
   positioning an electrically insulating material on the pinned magnetic region;
   positioning a free magnetic region having an is easy axis, a resultant magnetic moment vector, and a magnetic switching volume on the electrically insulating material wherein the resultant magnetic moment vector can be oriented one of parallel and anti-parallel with respect to the resultant magnetic moment vector of the pinned magnetic region, the free magnetic region includes a synthetic anti-ferromagnetic layer material which includes N ferromagnetic layers that are anti-ferromagnetically coupled, where N is a whole number greater than or equal to two and where each N ferromagnetic layer has a magnetic moment vector and the magnetic moment vectors of each adjacent N layer of ferromagnetic material are oriented. anti-parallel wherein the magnetic fringing field creates a bias field within the free magnetic region,
   operating the magnetoresistive tunneling junction memory cell to operate in a toggle writing mode.

19. A method as claimed in claim 19 including in addition the step of choosing the resultant magnetic moment vector of the pinned magnetic region to obtain the magnetic fringing field.

20. A method as claimed in claim 18 including in addition the step of choosing at least one of the thickness of the pinned magnetic region and the material included in the pinned magnetic region to obtain the magnetic fringing field.

21. A method as claimed in claim 18 including in addition the step of choosing the magnetic fringing field to obtain the switching field.

22. A method as claimed in claim 18 wherein the switching field is reduced by an amount approximately equal to the bias field.

23. A method as claimed in claim 18 wherein the magnetic fringing field is aligned in a direction substantially parallel with the easy axis.

* * * * *

UNITED STATES PATENT AND TRADEMARK OFFICE
CERTIFICATE OF CORRECTION

PATENT NO.    : 6,633,498 B1
DATED         : October 14, 2003
INVENTOR(S)   : Bradley N. Engel et al.

It is certified that error appears in the above-identified patent and that said Letters Patent is hereby corrected as shown below:

<u>Title page,</u>
After the Title, please add as a new first paragraph the following paragraph:
    -- This invention was made with Government support under Agreement No. MDA972-96-3-0016 awarded by DARPA. The Government has certain rights in the invention. --

Signed and Sealed this

Sixteenth Day of December, 2003

JAMES E. ROGAN
*Director of the United States Patent and Trademark Office*